(12) United States Patent
Franke et al.

(10) Patent No.: US 11,360,380 B2
(45) Date of Patent: Jun. 14, 2022

(54) EXTREME ULTRAVIOLET LITHOGRAPHY DEVICE

(71) Applicant: IMEC VZW, Leuven (BE)

(72) Inventors: Joern-Holger Franke, Auderghem (BE); Emily Gallagher, Burlington, VT (US)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/926,460

(22) Filed: Jul. 10, 2020

(65) Prior Publication Data

US 2021/0011370 A1 Jan. 14, 2021

(30) Foreign Application Priority Data

Jul. 11, 2019 (EP) .................................... 19185767

(51) Int. Cl.
*G03F 1/62* (2012.01)
*G03F 7/20* (2006.01)

(52) U.S. Cl.
CPC ............ *G03F 1/62* (2013.01); *G03F 7/70033* (2013.01); *G03F 7/70833* (2013.01); *G03F 7/70983* (2013.01)

(58) Field of Classification Search
None
See application file for complete search history.

(56) References Cited

U.S. PATENT DOCUMENTS

| RE41,667 | E | * | 9/2010 | Antoni | G02B 27/0961 |
| | | | | | 250/492.2 |
| 9,897,930 | B2 | * | 2/2018 | Sjmaenok | G03F 7/70575 |
| 11,042,085 | B2 | | 6/2021 | Ono et al. | |

FOREIGN PATENT DOCUMENTS

| EP | 3483655 A1 | 5/2019 |
| TW | 201821359 A | 6/2018 |

OTHER PUBLICATIONS

Extended European Search Report, EP Application No. 19185767.1, dated Jan. 8, 2020, 12 pages.

(Continued)

*Primary Examiner* — Michelle M Iacoletti
(74) *Attorney, Agent, or Firm* — McDonnell Boehnen Hulbert & Berghoff LLP

(57) ABSTRACT

The present disclosure relates to an extreme ultraviolet lithography, EUVL, device comprising: a reticle comprising a lithographic pattern to be imaged on a target wafer; a light-transmissive pellicle membrane mounted in front of, and parallel to, the reticle, wherein the pellicle membrane scatters transmitted light along a scattering axis; and an extreme ultraviolet, EUV, illumination system configured to illuminate the reticle through the pellicle membrane, wherein an illumination distribution provided by the EUV illumination system is asymmetric as seen in a source-pupil plane of the EUV illumination system; wherein light reflected by the reticle and then transmitted through the pellicle membrane comprises a non-scattered fraction and a scattered fraction formed by light scattered by the pellicle membrane; the EUVL device further comprising: an imaging system having an acceptance cone configured to capture a portion of the light reflected by the reticle and then transmitted through the pellicle membrane.

7 Claims, 2 Drawing Sheets

(56) References Cited

OTHER PUBLICATIONS

Mochi, Iacopo, Marina Timmermans, Emily Gallagher, Marina Mariano Juste, Ivan Pollentier, Rajendran Rajeev, Patrick Helfenstein, Sara Fernandez, Dimitrios Kazazis, and Yasin Ekinci. "Experimental evaluation of the impact of EUV pellicles on reticle imaging." In Photomask Technology 2018, vol. 10810, p. 108100Y. International Society for Optics and Photonics, 2018.

Timmermans, Marina Y., Ivan Pollentier, Jae Uk Lee, Johan Meersschaut, Olivier Richard, Christoph Adelmann, Cedric Huyghebaert, and Emily E. Gallagher. "CNT EUV pellicle: moving towards a full-size solution." In Photomask Technology 2017, vol. 10451, p. 104510P. International Society for Optics and Photonics, 2017.

Gallagher, Emily, Marina Y. Timmermans, Ivan Pollentier, Jae Uk Lee, Marina Mariano, Christoph Adelmann, Cedric Huyghebaert, Frank Scholze, and Christian Laubis. "CNTs in the context of EUV pellicle history." In Extreme Ultraviolet (EUV) Lithography IX, vol. 10583, p. 105831E. International Society for Optics and Photonics, 2018.

Timmermans, Marina Y., Marina Mariano, Ivan Pollentier, Olivier Richard, Cedric Huyghebaert, and Emily E. Gallagher. "Freestanding carbon nanotube films for extreme ultraviolet pellicle application." Journal of Micro/Nanolithography, MEMS, and MOEMS 17, No. 4 (2018): 043504.

\* cited by examiner

EXTREME ULTRAVIOLET LITHOGRAPHY DEVICE

CROSS-REFERENCE TO RELATED APPLICATIONS

The present application is a non-provisional patent application claiming priority to European Patent Application No. EP 19185767.1, filed Jul. 11, 2019, the contents of which are hereby incorporated by reference.

FIELD OF THE DISCLOSURE

The present disclosure relates to an Extreme Ultraviolet Lithography (EUVL) device and method.

BACKGROUND

In semiconductor fabrication, various photolithographic processes are extensively used in the course of defining devices and circuit patterns. Depending on the size of the features to be defined, different optical lithographic processes may be used. In a photolithographic process, a pattern present on a photomask or reticle may be transferred to a light-sensitive photoresist coating by illuminating the reticle. Typically, light is modulated by the reticle pattern and imaged onto a wafer coated with the light-sensitive photoresist.

In conventional photolithography, a pellicle is commonly placed on the reticle in order to protect the reticle from contamination during handling and exposure. The pellicle will among others protect the reticle from unwanted particles which otherwise could negatively affect the fidelity of the pattern on the reticle, and therefore the transfer of the pattern to the wafer.

As the patterns become smaller, there is an interest in utilizing shorter wavelengths. In extreme ultraviolet lithography, EUVL, a wavelength of about 13.5 nm is frequently used. The shift to shorter wavelengths has triggered a search for new pellicle designs, which provide a high transmissivity to EUV radiation and can withstand the typically harsh conditions in EUVL devices.

SUMMARY

The present disclosure is based on a realization that typical pellicle designs intended for use in extreme ultraviolet, EUVL, devices may cause a non-negligible, directionally-scattering of light transmitted through the pellicle. If light scattered by the pellicle is collected by an imaging system of the EUVL device, this may cause decreased fidelity of the pattern transferred to a target wafer. For example, the light scattered by the pellicle can cause optical issues, such as imaging errors, in the EUVL device.

Embodiments of the present disclosure describe an EUVL device which addresses the issue of pellicle light scattering. Further or alternative embodiments may be understood from the following.

According to a first aspect, an extreme ultraviolet lithography (EUVL) device is provided. The EUVL device comprises: a reticle comprising a lithographic pattern to be imaged on a target wafer; a light-transmissive pellicle membrane mounted in front of, and parallel to, the reticle, wherein the pellicle membrane scatters transmitted light along a scattering axis; and an extreme ultraviolet (EUV) illumination system configured to illuminate the reticle through the pellicle membrane, wherein an illumination distribution provided by the EUV illumination system is asymmetric as seen in a source-pupil plane of the EUV illumination system; wherein (in use of the EUVL device) light reflected by the reticle and then transmitted through the pellicle membrane comprises a non-scattered fraction and a scattered fraction formed by light scattered by the pellicle membrane; the EUVL device further comprising: an imaging system having an acceptance cone configured to capture a portion of the light reflected by the reticle and then transmitted through the pellicle membrane, wherein the imaging system is configured to project the captured portion onto the target wafer; wherein the scattering axis is oriented with respect to the illumination distribution such that a scattered fraction of the captured portion is reduced compared to at least one other orientation of the scattering axis.

In state of the art EUVL, asymmetric illumination distributions are typically used for improved pattern transfer from a reticle to a target wafer, since some parts of the source-pupil plane are more important to illuminate than others. Typically, the non-scattered fraction of light transmitted through the pellicle membrane is greater, or much greater, than the scattered fraction. For example, the non-scattered fraction may be 90%-95% of the light transmitted through the pellicle membrane, and the scattered fraction may be 5%-10% of the light transmitted through the pellicle membrane. The scattered fraction of light is typically of no use, or even detrimental, for the purpose of pattern transfer from the reticle to the target wafer. However, the use of a pellicle membrane having a scattering axis, allows for the total amount of scattered light actually captured by the acceptance cone of the imaging system to be reduced by a deliberate orientation of the pellicle membrane (and as a consequence a deliberate orientation of the scattering axis thereof). In other words, a ratio of captured scattered light to captured non-scattered light may be reduced. For example, the orientation of the scattering axis with respect to the illumination distribution is such that the ratio is minimized.

A cross section of the acceptance cone of the imaging system may be circular.

The above-discussed merits of the EUVL device may thus be enjoyed with an imaging system having an acceptance cone with a circular/symmetric cross section, as is commonly used in various state of the art lithography applications. Put differently, the amount of scattered light imaged onto the target wafer may be reduced without any complex re-design of the imaging system.

The pellicle membrane may comprise at least one sheet of carbon nanotube bundles. The at least one sheet of carbon nanotube bundles may in particular comprise a plurality of substantially parallel carbon nanotube bundles.

A pellicle membrane based on sheets of carbon nanotube, CNT, bundles offer low degrees of absorption of EUV light. The elongated shape, and the parallel arrangement, of the CNT bundles may however cause light transmitted through the pellicle membrane to scatter predominantly in a direction perpendicular to a longitudinal extension of the CNT bundles.

Thus, the increased structural regularity offered by a CNT-based pellicle membrane may translate to a pellicle membrane having a distinct scattering axis perpendicular, at least substantially perpendicular, to the longitudinal extension of the CNT bundles. This may facilitate deflecting a large proportion of the scattered fraction, formed by light scattered by the pellicle membrane, outside of the acceptance cone of the imaging system. A fidelity of the transferred pattern on the target wafer may thereby be improved.

The illumination distribution may comprise a distribution of source pixels.

A source pixel may be a direction, or a narrow range of directions, from which light illuminates the reticle.

The illumination distribution may be optimized with respect to the lithographic pattern of the reticle such that the source pixels predominantly fall within two opposite quadrants in the source-pupil plane, wherein the scattering axis may be oriented at an angle of 45° or less relative to a geometrical source-pupil axis (for example, 0°). The geometrical source-pupil axis is defined to extend to divide each of the two opposite quadrants into two equally sized octants.

Example embodiments of the present disclosure provide illumination distribution with respect to the lithographic pattern of the reticle is that a fidelity of the pattern transferred to the target wafer may be improved. For such a source pixel distribution, it may in view of the above discussion be understood that most of the scattered light also will fall in the quadrants. An orientation of the scattering axis at an angle of 45° or less relative to the geometrical source-pupil axis allows scattered light/scattered source-pixels to be directed outside of the acceptance cone of the imaging system to an increasing extent, becoming maximum at 0°.

The asymmetric illumination distribution provided by the EUV illumination system may be a predominantly dipole-shaped or quadrupole-shaped illumination distribution.

A further scope of applicability of the present disclosure will become apparent from the detailed description given below. However, it should be understood that the detailed description and specific examples, while indicating example embodiments of the present disclosure, are given by way of illustration only, since various changes and modifications within the scope of the present disclosure will become apparent to those skilled in the art from this detailed description.

BRIEF DESCRIPTION OF THE FIGURES

The above, as well as additional, features will be better understood through the following illustrative and non-limiting detailed description of example embodiments, with reference to the appended drawings.

The above and other aspects of the present disclosure will now be described in more detail, with reference to appended drawings showing embodiments of the disclosure. The figures should not be considered limiting the disclosure to the specific embodiment; instead they are used for explaining and understanding the disclosure.

As illustrated in the figures, the sizes of layers and regions are exaggerated for illustrative purposes and, thus, are provided to illustrate the general structures of embodiments of the present disclosure. Like reference numerals refer to like elements throughout.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will now be described more fully hereinafter with reference to the accompanying drawings, in which example embodiments of the present disclosure are shown. This inventive concept may, however, be implemented in many different forms and should not be construed as limited to the variants set forth herein; rather, these variants are provided for thoroughness and completeness, and fully convey the scope of the present disclosure to the skilled person.

Figure 1A:
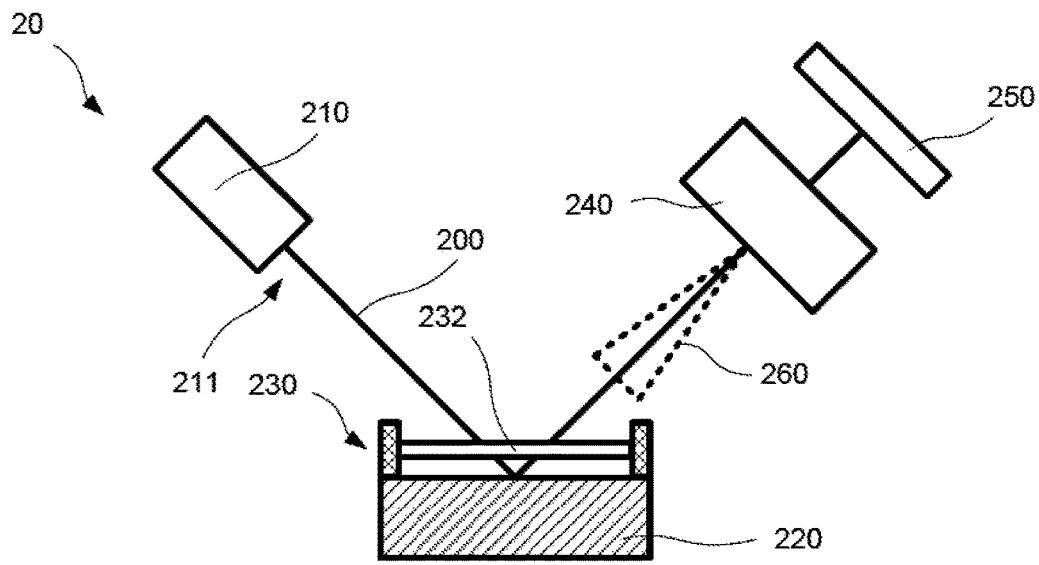
FIG. 1A illustrates a schematic view of an extreme ultraviolet lithography (EUVL) device, according to an example embodiment.

FIG. 1A illustrates a schematic view of an extreme ultraviolet lithography, EUVL, device 20, such as an EUVL scanner. The EUVL device 20 comprises a reticle 220, a light-transmissive pellicle membrane 232, an extreme ultraviolet, EUV, illumination system 210, and an imaging system 240. The EUVL device 20 may have an optical axis 200 as exemplified in FIG. 1A. The EUVL device 20 may be an EUVL scanner.

The reticle 220 comprises a lithographic pattern to be imaged on a target wafer 250. The reticle 220 may be configured to reflect light impinging on the reticle 220. The lithographic pattern of the reticle 220 may diffract light impinging on the reticle 220 in a plurality of diffraction orders. The reticle 220 may define a reticle plane. It is envisaged that the lithographic pattern may be of any type conventionally used in manufacture of semiconductor devices, e.g. for the purpose of "printing" patterns to be used for line and via formation in back-end-of-line interconnect structures, for patterning of semiconductor structures such as semiconductor fins or pillars, etc. By way of example, a reticle may comprise a line-based reticle pattern, e.g. comprising a plurality of parallel spaced-apart lines.

The light-transmissive pellicle membrane 232 is mounted in front of, and parallel to, the reticle 220. The pellicle membrane 232 may as shown in FIG. 1 be mounted in front of the reticle 220, as seen from the EUV illumination system 210. The pellicle membrane 232 may be comprised in a pellicle 230 comprising a frame to which the pellicle membrane 232 is attached. The pellicle membrane 232 is transmissive to EUV radiation. EUV radiation may be electromagnetic radiation (i.e., light) having a wavelength shorter than 15 nm, in some examples in a range from 13.3 to 13.7 nm. The pellicle membrane 232 may by way of example present an EUV single-pass transmission of at least 80%, in some examples greater than 90%. Of the light transmitted by the pellicle membrane 232, a fraction may be scattered by the pellicle membrane 232. Hence, the light transmitted by the pellicle membrane 232 may comprise a non-scattered fraction and a scattered fraction. The structure of the pellicle membrane 232 is such that the pellicle membrane 232 scatters transmitted light along a scattering axis 214. As may be appreciated, a pellicle membrane 232 providing scattering of transmitted light along a scattering axis may, if illuminated with light of an isotropic illumination distribution, scatter the isotropic illumination distribution into an elliptical scattering pattern having a major axis parallel to the scattering axis 214.

The pellicle membrane 232 may comprise at least one sheet of carbon nanotube bundles. A carbon nanotube bundle may have a width of at least 10 nm. At least one sheet of carbon nanotube bundles may comprise a plurality of substantially parallel carbon nanotube bundles. The plurality of substantially parallel carbon nanotube bundles may be substantially parallel to the pellicle membrane 232. Each carbon nanotube bundle in the plurality of substantially parallel carbon nanotube bundles may be separated by a distance from at least 10 nm to 500 nm from a neighboring carbon nanotube bundle. The plurality of substantially parallel carbon nanotube bundles may be arranged in a quasi-periodic pattern. The quasi-periodic pattern may have an average pitch of at least 50 nm. Although a carbon nanotube-based structure of the pellicle membrane 232 may be desirable in some examples, it is contemplated that the EUVL device 20 may be used with any type of EUV transmissive membrane providing scattering of transmitted light along a scattering axis.

The EUV illumination system 210 is configured to illuminate the reticle 220 through the pellicle membrane 232. To enable high-fidelity pattern transfer from the reticle 220 to the target wafer 250, the EUV illumination system 210 is configured to emit light in an illumination distribution 212, which is asymmetric as seen in a source-pupil plane of the EUV illumination system 210. The source-pupil plane may coincide with a plane of an exit pupil 211 of the EUV illumination system 210. The source-pupil plane may be a plane between the EUV illumination system 210 and the pellicle membrane 232. The source-pupil plane may be a plane between a last beamforming optic of the EUV illumination system 210 and the pellicle membrane 232. The source-pupil plane may be orthogonal to the optical axis 200 of the EUVL device 20. The light emitted by the EUV illumination system 210 may be generated by an EUV light source of the illumination system 210. The EUV light source may be of a conventional type, such as a laser induced plasma light source. The EUV light source may emit light of a broad range of wavelengths. The EUV illumination system 210 may comprise optics configured to filter light emitted by the EUV light source, such that light of a narrower wavelength range reaches the pellicle membrane 232. For instance, light that reaches the pellicle membrane 232 may have wavelengths shorter than 15 nm, in some examples within a range from 13.3 to 13.7 nm. The EUV illumination system 210 may comprise optics configured to shape light generated by the EUV light source. More specifically, the optics may be configured to shape the illumination distribution 212 of the illumination system 210 and direct the light to illuminate the reticle 220. The optics may be reflective optics, such as EUV reflective mirrors. The optics may comprise collimating optics and/or optics arranged for illuminating the reticle 220.

As may be understood from the above discussion, light from the EUV illumination system 210 which is reflected by the reticle 220 and then transmitted through the pellicle membrane 232 will comprise a non-scattered fraction and a scattered fraction formed by light scattered by the pellicle membrane 232. It is to be understood that non-scattered fraction of light represents the fraction that is useful for the pattern transfer. The non-scattered fraction may accordingly comprise light reflected by the reticle 220, at least portions of which being diffracted by the reticle 220. It is to be understood that the non-scattered fraction of light is formed by light that first has been transmitted through the pellicle membrane 232 (without being scattered), then reflected by the reticle 220, and then again transmitted through the pellicle membrane 232 (without being scattered). The scattered fraction of light meanwhile represents a fraction of light that is not useful, or even detrimental, for the pattern transfer. When reference in the following is made to the scattered fraction, reference is made to light that first has been transmitted through the pellicle membrane 232 (first passage), then reflected by the reticle 220, and then again transmitted through the pellicle membrane 232 (second passage), the light undergoing scattering during at least one of the first and the second passage.

The imaging system 240 has an acceptance cone 260 configured to capture a portion of the light reflected by the reticle 220 and then transmitted through the pellicle membrane 232. The imaging system 240 is configured to project the captured portion onto the target wafer 250. The imaging system 240 may comprise optics. The optics may be reflective optics.

A cross section 262 of the acceptance cone 260 of the imaging system 240 may be circular. The acceptance cone 260 of the imaging system 240 may for instance correspond to a (reticle side) numerical aperture in a range from 0.05 to 0.125.

The scattering axis 214 is oriented with respect to the illumination distribution 212 such that a scattered fraction of the captured portion is reduced compared to at least one other orientation of the scattering axis 214. In other words, a ratio of the scattered fraction captured by the acceptance cone 260 to the non-scattered fraction captured by the acceptance cone 260 may be reduced or, in some examples, minimized.

The illumination distribution 212 may be characterized as comprising a distribution of source pixels 213. Accordingly, light associated with each source pixel may be transmitted through the pellicle membrane 232, then reflected by the reticle 220, and then transmitted through the pellicle membrane 232.

The asymmetric illumination distribution 212 provided by the EUV illumination system 210 may be optimized with respect to the transfer of the lithographic pattern of the reticle 220 to the target wafer 250. The illumination distribution 212 may be optimized with respect to the lithographic pattern of the reticle 220 such that the source pixels 213 predominantly fall within two mutually opposite quadrants 2622, 2624 in the source-pupil plane. A geometrical source-pupil axis 263 may extend to divide each of the two opposite quadrants 2622, 2624 into two equally sized octants, and the scattering axis 214 may be oriented at an angle of 45° or less relative to the source-pupil axis 263.

The asymmetric illumination distribution 212 provided by the EUV illumination system 210 may be a predominantly dipole-shaped or quadrupole-shaped illumination distribution. Light associated with the predominantly dipole-shaped or quadrupole-shaped illumination distribution may to a greater extent be separated along a main direction compared to a different direction perpendicular to the main direction.

The main direction may be parallel to the geometrical source-pupil axis 263, and light associated with the dipole-shaped or quadrupole-shaped illumination distribution may predominantly fall within the two mutually opposite quadrants 2622, 2624. The predominantly dipole-shaped illumination distribution may be specifically optimized to transfer, from the reticle 220 to the target wafer 250, lithographic patterns comprising lines and spaces oriented along a direction perpendicular to the main direction. In case the lines and/or spaces are occasionally broken, a quadrupole-shaped illumination distribution may be desirable for pattern transfer from the reticle 220 to the target wafer 250. A standard approach within the art to determine the desired illumination distribution for pattern transfer is numerical methods, typically called source and mask optimization (SMO). Typically, the source (i.e., illumination distribution 212) and the mask (i.e., lithographic pattern on the reticle 220) are co-designed to improve the projection of the pattern on the target wafer 250.

Figure 1B:
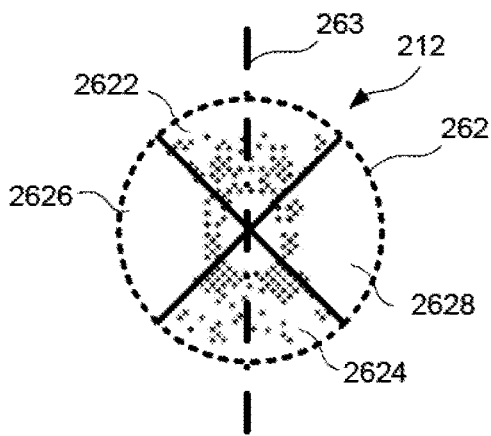
FIG. 1B illustrates, in the source-pupil plane of the EUVL device, an asymmetric illumination distribution with the cross section of the acceptance cone superimposed, according to an example embodiment.

FIG. 1B illustrates, in the source-pupil plane of the EUVL device 20, an asymmetric illumination distribution 212 with the cross section 262 of the acceptance cone 260 superimposed. The asymmetric illumination distribution 212 may be seen as a distribution of different angles/directions with which light illuminates the reticle 220. In the example shown in FIG. 1B, light scattering introduced by the pellicle membrane 232 is not shown. The asymmetric illumination distribution 212 is depicted as a distribution of source pixels 213. In the example shown in FIG. 1B, the source pixels 213 predominantly fall within a first quadrant 2622 and a second quadrant 2624 in the source-pupil plane. In other words, the source pixels 213 predominantly fall within two opposite quadrants 2622, 2624 in the source-pupil plane. A geometrical source-pupil axis 263 extends to divide the first quadrant 2622 and the second quadrant 2624 in equally sized octants, as shown in FIG. 1B.

Figure 1C:
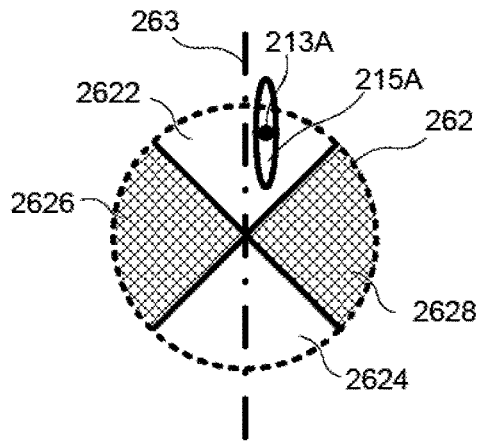
FIG. 1C illustrates, in the source-pupil plane of the EUVL device, a single source pixel with a scattering pattern, and with the cross section of the acceptance cone superimposed, according to an example embodiment.

As light associated with each source pixel is transmitted through the pellicle membrane 232, a part of that light is scattered in a direction parallel to the scattering axis 214. Thus, at least a part of light associated with each source pixel in FIG. 1B is scattered (not shown in FIG. 1B) along the scattering axis 214. Therefore, by orienting the scattering axis 214 of the pellicle membrane 232 such that it is parallel to the geometrical source-pupil axis 263, the scattered fraction of light within the cross section 262 of the acceptance cone 260 of the imaging system 240 may be minimized. This may be understood by considering a single source pixel 213A close to a boundary of the cross section 262, as is shown in FIG. 1C. In FIG. 1C, light associated with the single source pixel 213A is shown with an example scattering pattern 215a resulting from the scattering along a scattering axis 214 by the pellicle membrane 232. It is to be understood that the scattering pattern 215a is an example only, and that it may have other shapes, e.g. be more/less elongated than as depicted in FIG. 1C. In the example shown in FIG. 1C, the scattering axis 214 is oriented along the geometrical source-pupil axis 263. Since the direction of the scattering pattern 215a of light associated with the single source pixel 213A is oriented in the same direction as the scattering axis 214, it is also oriented along the geometrical source-pupil axis 263. As is seen in FIG. 1C, a part of the scattering pattern 215a of light associated with the single source pixel 213A falls outside the cross section 262 of the acceptance cone 260 and is therefore not captured by the imaging system 240. Since light associated with each source pixel (e.g., the source pixels 213 shown in FIG. 1B) is scattered in a similar manner as light associated with the single source pixel 213A in FIG. 1C, the fraction of light scattered in by the pellicle membrane 232 inside the cross section 262 (and therefore captured by the imaging system 240) may be reduced by orienting the scattering axis 214 parallel to the geometrical source-pupil axis 263. From the above description, it is understood that the scattered fraction of light may be reduced by orienting scattering axis 214 at an angle smaller than 45° relative to the geometrical source-pupil axis 263, compared to an orientation greater than 45°.

Now, an example algorithm to find the orientation of the scattering axis 214 with respect to the illumination distribution 212 such that the scattered fraction of the captured portion is minimized will be described with reference to FIG. 2. The orientation of the scattering axis 214 with respect to the illumination distribution 212 such that the scattered fraction of the captured portion is minimized may be determined by finding an orientation of the scattering axis 214, with respect to the illumination distribution 212, such that a weighted sum of distances from each source pixel to a boundary of the cross section 262 of the acceptance cone 260 along a direction of the scattering axis 214 is minimized. Each weight in the weighted sum may be based on a position of each source pixel in the weighted average within the cross section 262 of the acceptance cone 260. Each weight in the weighted sum may account for the exponential decay of scattering intensity. Thus, the orientation of the scattering axis 214 may be found by the following optimization problem for N source pixels 213:

$$\min_{\alpha} \sum_{i=1}^{N} w_i \cdot r_i(\alpha),$$

where a is the orientation of the scattering axis 214, $w_i$ is the weight for the i:th source pixel, and $r_i(\alpha)$ is the distance from the i:th source pixel to the boundary of the cross section 262 along the orientation α of the scattering axis 214. By solving the above optimization problem, an orientation $\alpha_{min}$ of the scattering axis 214 that minimizes the averaged distance along the scattering axis 214 from the source pixels 213 to the boundary of the cross section 262 of the acceptance cone 260 may be found.

Figure 2A:
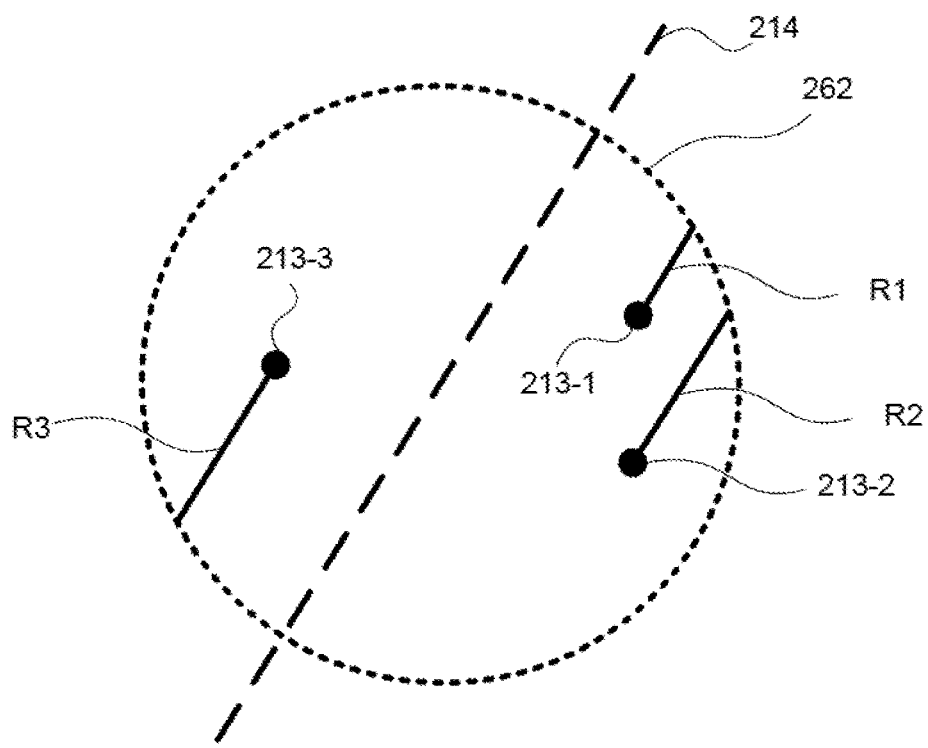
FIG. 2A illustrates, in the source-pupil plane of the EUVL device, an illumination distribution comprising source pixels, where the scattering axis is oriented along a first direction, according to an example embodiment.

For the simplified example shown in FIG. 2A, the illumination distribution 212 comprises a first source pixel 213-1, a second source pixel 213-2, and a third source pixel 213-3. It is to be understood that illumination distributions typically comprise a large number of source pixels 213, e.g. as illustrated in FIG. 1B. The scattering axis 214 in FIG. 2A is oriented in an orientation α relative to the illumination distribution 212. Each source pixel 213-1, 213-2, 213-3 is at a distance $r_1$, $r_2$, $r_3$ (labelled R1, R2, R3 in FIG. 1D and FIG. 1E) from the boundary of the cross section 262 of the acceptance cone 260 in a direction parallel to the scattering axis 214. Thus, by varying the orientation of the scattering axis 214, the distances $r_1$ from each source pixel to the boundary of the cross section 262 is varied correspondingly. By solving the above-mentioned optimization problem, the orientation $\alpha_{min}$ of the scattering axis 214 that minimizes the averaged distance from the source pixels 213 to the boundary of the cross section 262 may be found. Then, since light associated with each source pixel 213-1, 213-2, 213-3 may be scattered along the scattering axis 214, orienting the scattering axis 214 according to the orientation $\alpha_{min}$ (i.e., minimizing the averaged distance along the scattering axis 214 from each source pixel 213-1, 213-2, 213-3 to the boundary of the cross section 262), the scattered fraction of the captured portion (i.e., light within the cross section 262 of the acceptance cone 260) of light may be minimized.

Figure 2B:
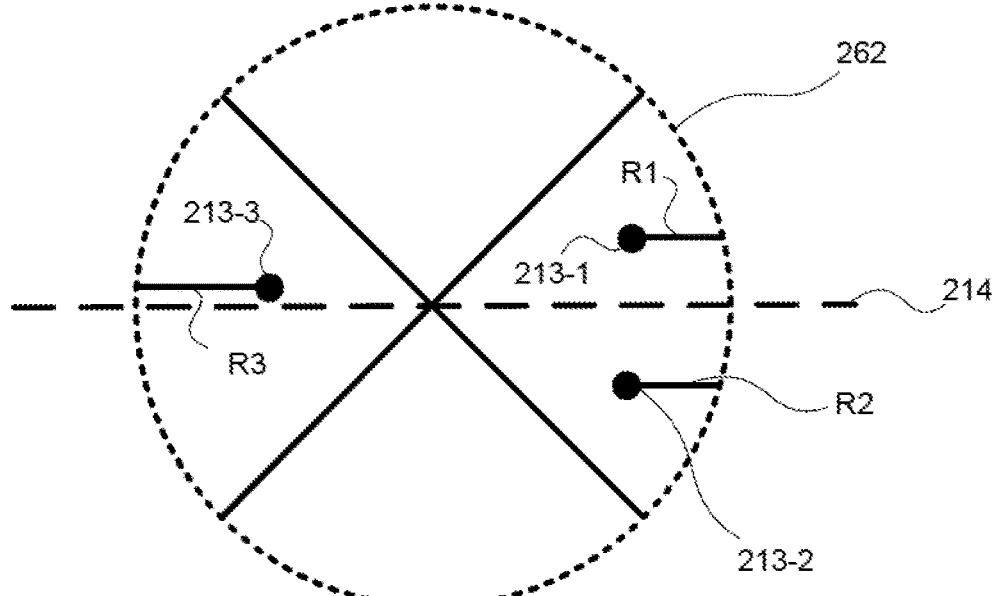
FIG. 2B illustrates, in the source-pupil plane of the EUVL device, an illumination distribution comprising source pixels, where the scattering axis is oriented along a direction that is found by minimizing the averaged distance from each source pixel to the boundary of the cross section, according to an example embodiment.

The orientation of the scattering axis 214 in the example shown in FIG. 2A that is determined by solving the above-mentioned optimization is shown in FIG. 2B. Also, as is seen in FIG. 2B, orienting the scattering axis 214 in the direction found by solving the optimization problem may result in that the source pixels 213 fall predominantly within two opposite quadrants, where the quadrants are defined such that the scattering axis 214 divides the opposite quadrants into equally sized octants. In other words, the orientation of the scattering axis 214 found by solving the above-mentioned optimization problem may be parallel to the geometrical source-pupil axis 263.

It is to be understood that the orientation of the scattering axis 214 may be determined in other manners as described above. For example, other numerical methods may be used to determine the orientation of the scattering axis relative to the illumination distribution such that the scattered fraction of the captured portion is reduced. As another example, the orientation of the scattering axis may be determined through a trial and error approach, where different orientations of the axis are tested in order to determine which orientation reduces/minimizes the scattered fraction of the captured potion.

The person skilled in the art realizes that the present disclosure by no means is limited to the example embodiments described above. On the contrary, many modifications and variations are possible within the scope of the appended claims.

Additionally, variations to the disclosed variants can be understood and effected by the skilled person in practicing the claimed disclosure, from a study of the drawings, the disclosure, and the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. An extreme ultraviolet lithography (EUVL) device comprising:
    a reticle comprising a lithographic pattern to be imaged on a target wafer;
    a light-transmissive pellicle membrane mounted in front of, and substantially parallel to, the reticle, wherein the light-transmissive pellicle membrane scatters transmitted light along a scattering axis;
    an extreme ultraviolet (EUV) illumination system configured to illuminate the reticle through the light-transmissive pellicle membrane, wherein an illumination distribution provided by the EUV illumination system is asymmetric as seen in a source-pupil plane of the EUV illumination system, wherein light reflected by the reticle and then transmitted through the light-transmissive pellicle membrane comprises a non-scattered fraction and a scattered fraction formed by light scattered by the light-transmissive pellicle membrane;
    an imaging system having an acceptance cone configured to capture a portion of the light reflected by the reticle and then transmitted through the light-transmissive pellicle membrane, wherein the imaging system is configured to project the captured portion of light onto the target wafer; and
    wherein the scattering axis is oriented with respect to the illumination distribution such that a scattered fraction of the captured portion of light is reduced compared to at least one other orientation of the scattering axis.

2. The EUVL device according to claim 1, wherein a cross section of the acceptance cone of the imaging system is circular.

3. The EUVL device according to claim 2, wherein the light-transmissive pellicle membrane comprises at least one sheet of carbon nanotube bundles.

4. The EUVL device according to claim 3, wherein at least one sheet of carbon nanotube bundles comprises a plurality of substantially parallel carbon nanotube bundles.

5. The EUVL device according to claim 1, wherein the illumination distribution is optimized with respect to the lithographic pattern of the reticle such that the source pixels predominantly fall within two opposite quadrants in the source-pupil plane, wherein the scattering axis is oriented at an angle of 45° or less relative to a geometrical source-pupil axis, the geometrical source-pupil axis extending to divide each of the two opposite quadrants into two equally sized octants.

6. The EUVL device according to claim 1, wherein the asymmetric illumination distribution provided by the EUV illumination system is a predominantly dipole-shaped or quadrupole-shaped illumination distribution.

7. A method of extreme ultraviolet lithography (EUVL), the method comprising:
    imaging, via an imaging system, a reticle comprising a lithographic pattern on a target wafer;
    scattering transmitted light, via a light-transmissive pellicle membrane, along a scattering axis, wherein the light-transmissive pellicle membrane is mounted in front of and substantially parallel to the reticle;
    illuminating, via an extreme ultraviolet (EUV) illumination system, the reticle through the light-transmissive pellicle membrane, wherein an illumination distribution provided by the EUV illumination system is asymmetric as seen in a source-pupil plane of the EUV illumination system, wherein light reflected by the reticle and transmitted through the light-transmissive pellicle membrane comprises a non-scattered fraction and a scattered fraction formed by light scattered by the light-transmissive pellicle membrane;
    capturing, via an acceptance cone on the imaging system, a portion of light reflected by the reticle and then transmitted through the light-transmissive pellicle membrane; and
    projecting, via the imaging system, the captured portion of light onto the target wafer, wherein the scattering axis is oriented with respect to the illumination distribution such that a scattered fraction of the captured portion of light is reduced compared to at least one other orientation of the scattering axis.

* * * * *